(12) United States Patent
Tay et al.

(10) Patent No.: US 8,134,227 B2
(45) Date of Patent: Mar. 13, 2012

(54) STACKED INTEGRATED CIRCUIT PACKAGE SYSTEM WITH CONDUCTIVE SPACER

(75) Inventors: Lionel Chien Hui Tay, Singapore (SG); Rui Huang, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 3 days.

(21) Appl. No.: 11/694,927

(22) Filed: Mar. 30, 2007

(65) Prior Publication Data
US 2008/0237825 A1   Oct. 2, 2008

(51) Int. Cl.
H01L 23/02 (2006.01)
H01L 23/48 (2006.01)
H01L 23/52 (2006.01)
H01L 29/40 (2006.01)
H01L 23/28 (2006.01)
H01L 23/29 (2006.01)

(52) U.S. Cl. ........ 257/686; 257/685; 257/737; 257/738; 257/777; 257/778; 257/787; 257/788; 257/789; 257/795

(58) Field of Classification Search .......... 257/685–686, 257/777–778, 787–789, 795, 737–738
See application file for complete search history.

(56) References Cited

U.S. PATENT DOCUMENTS

| | | | |
|---|---|---|---|
| 5,233,504 A | | 8/1993 | Melton et al. |
| 5,923,090 A | | 7/1999 | Fallon et al. |
| 6,137,164 A | * | 10/2000 | Yew et al. ..................... 257/686 |
| 6,288,451 B1 | * | 9/2001 | Tsao ............................... 257/778 |
| 6,528,894 B1 | * | 3/2003 | Akram et al. ................. 257/788 |
| 6,555,917 B1 | * | 4/2003 | Heo ............................... 257/777 |
| 6,583,512 B2 | * | 6/2003 | Nakaoka et al. .............. 257/777 |
| 6,717,253 B2 | * | 4/2004 | Yang ............................. 257/686 |
| 6,762,488 B2 | * | 7/2004 | Maeda et al. ................. 257/686 |
| 6,768,190 B2 | * | 7/2004 | Yang et al. .................... 257/686 |
| 6,820,329 B2 | * | 11/2004 | Fang ............................. 29/840 |
| 6,833,628 B2 | * | 12/2004 | Brandenburg et al. ........ 257/778 |
| 6,857,470 B2 | * | 2/2005 | Park et al. ..................... 165/185 |
| 6,870,269 B2 | * | 3/2005 | Derderian ..................... 257/777 |
| 6,885,093 B2 | * | 4/2005 | Lo et al. ........................ 257/686 |
| 6,894,395 B2 | * | 5/2005 | Oshima ......................... 257/777 |
| 6,921,968 B2 | * | 7/2005 | Chung ........................... 257/686 |
| 6,933,176 B1 | | 8/2005 | Kirloskar et al. |
| 6,977,439 B2 | | 12/2005 | Kang et al. |
| 7,005,316 B2 | | 2/2006 | Lee et al. |
| 7,024,947 B2 | * | 4/2006 | Ishiguro et al. ........... 73/862.451 |
| 7,189,593 B2 | * | 3/2007 | Lee ................................ 438/107 |
| 7,211,466 B2 | * | 5/2007 | Lo et al. ........................ 438/109 |
| 7,242,099 B2 | * | 7/2007 | Lin et al. ....................... 257/778 |
| 7,245,003 B2 | * | 7/2007 | Li ................................... 257/660 |
| 7,268,426 B2 | * | 9/2007 | Warner et al. ................. 257/707 |
| 7,279,795 B2 | * | 10/2007 | Periaman et al. ............. 257/777 |
| 7,309,913 B2 | * | 12/2007 | Shim et al. .................... 257/686 |
| 7,355,274 B2 | * | 4/2008 | Lim ............................... 257/686 |
| 7,420,814 B2 | * | 9/2008 | Kim et al. ..................... 361/735 |
| 7,435,619 B2 | * | 10/2008 | Shim et al. .................... 438/107 |
| 7,518,226 B2 | * | 4/2009 | Cablao et al. ................. 257/686 |

(Continued)

Primary Examiner — Ida M Soward
(74) Attorney, Agent, or Firm — Mikio Ishimaru

(57) ABSTRACT

A stacked integrated circuit package system is provided including providing a first device and a second device with the first device, the second device, or a combination thereof having an integrated circuit die; forming a conductive spacer structure over the first device with the conductive spacer structure having a spacer filler around a conductive element; mounting the second device over the conductive spacer structure and the first device; and encapsulating the first device, the second device, and the conductive spacer structure.

10 Claims, 6 Drawing Sheets

U.S. PATENT DOCUMENTS

| | | | |
|---|---|---|---|
| 2002/0164838 A1* | 11/2002 | Moon et al. | 438/107 |
| 2003/0038356 A1* | 2/2003 | Derderian | 257/686 |
| 2004/0121521 A1* | 6/2004 | Jackson et al. | 438/108 |
| 2004/0126927 A1* | 7/2004 | Lin et al. | 438/107 |
| 2004/0201088 A1* | 10/2004 | Kim et al. | 257/686 |
| 2004/0238934 A1* | 12/2004 | Warner et al. | 257/686 |
| 2005/0006785 A1* | 1/2005 | Liu et al. | 257/777 |
| 2005/0110126 A1* | 5/2005 | Wu | 257/686 |
| 2005/0253240 A1* | 11/2005 | Nuechter et al. | 257/686 |
| 2005/0258545 A1* | 11/2005 | Kwon | 257/777 |
| 2005/0269676 A1* | 12/2005 | Lee et al. | 257/678 |
| 2006/0091562 A1* | 5/2006 | Lee | 257/778 |
| 2006/0097402 A1* | 5/2006 | Pu et al. | 257/777 |
| 2006/0197209 A1* | 9/2006 | Choi et al. | 257/686 |
| 2006/0289980 A1* | 12/2006 | Chang et al. | 257/679 |
| 2007/0152313 A1* | 7/2007 | Periaman et al. | 257/686 |
| 2007/0194415 A1* | 8/2007 | Seng et al. | 257/678 |
| 2007/0216005 A1* | 9/2007 | Yim et al. | 257/686 |
| 2007/0257348 A1* | 11/2007 | Yang | 257/686 |
| 2007/0278645 A1* | 12/2007 | Li | 257/686 |
| 2007/0278657 A1* | 12/2007 | Lee | 257/692 |
| 2007/0284756 A1* | 12/2007 | Tsai et al. | 257/777 |
| 2008/0042265 A1* | 2/2008 | Merilo et al. | 257/723 |
| 2008/0280396 A1* | 11/2008 | Kim et al. | 438/109 |
| 2009/0174051 A1* | 7/2009 | Osaka et al. | 257/686 |
| 2010/0230796 A1* | 9/2010 | Yim et al. | 257/686 |

* cited by examiner

STACKED INTEGRATED CIRCUIT PACKAGE SYSTEM WITH CONDUCTIVE SPACER

TECHNICAL FIELD

The present invention relates generally to integrated circuit package system, and more particularly to stacked integrated circuit package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

Numerous package approaches stack multiple integrated circuit dice or package in package (PIP) or a combination thereof. The electrical connections to the each of the stacked integrated circuit require an increased amount of space from by spacers, such as silicon or interposers, or by the space required for the electrical connections, such as wire loops for bond wires.

Current spacers require additional steps and structures increasing manufacturing costs and decreasing manufacturing yields. These spacers also limit the amount of height reduction. Space required for the different electrical connection types limit the overall size, e.g. height, width, and length, of the package. Other spacers, such as spacer films, offer potentially thinner spacing structures but do not provide sufficient rigidity or uniform thickness. These problems may result in tilting or non-uniform spacing between the stacked integrated circuits.

In addition, multi-chip packages, whether vertically or horizontally arranged, can also present problems because they usually must be assembled before the component chips and chip connections can be tested. The electrical bond pads on a die are so small, it is difficult to test die before assembly onto a substrate. Thus, when die are mounted and connected individually, the die and connections can be tested individually, and only known-good-die or known-good-device ("KGD"), free of defects, are then assembled into larger circuits. A fabrication process that uses KGD is therefore more reliable and less prone to assembly defects introduced due to bad die or bad devices.

For example, two of the common integrated circuit die stacking methods are: (a) larger lower die combined with a smaller upper die, and (b) so-called same-size die stacking. With the former, the die can be very close vertically since the electrical bond pads on the perimeter of the lower die extend beyond the edges of the smaller die on top. With same-size die stacking, the upper and lower dice are spaced more vertically apart to provide sufficient clearance for the bond wires to the lower die. As discussed, both these methods have inherent KGD and assembly process yield loss disadvantages since KGD cannot be used for fabricating these configurations.

Another example is package level stacking. This concept includes stacking of two or more packages. KGD and assembly process yields are not an issue since each package can be tested prior to assembly, allowing KGD to be used in assembling the stack. But package level stacking can pose other problems. One problem is package-to-package assembly process difficulties caused by irregularities in the flatness or co-planarity of the lower package. Another problem results from the increased stiffness of the overall assembly, which can lead to reduced board level reliability. Still another problem can arise from poor heat dissipation from the upper package.

Thus, a need still remains for a stacked integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including providing a first device and a second device with the first device, the second device, or a combination thereof having an integrated circuit die; forming a conductive spacer structure over the first device with the conductive spacer structure having a spacer filler around a conductive element; mounting a second device over the conductive spacer structure and the first device; and encapsulating the first device, the second device, and the conductive spacer structure.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
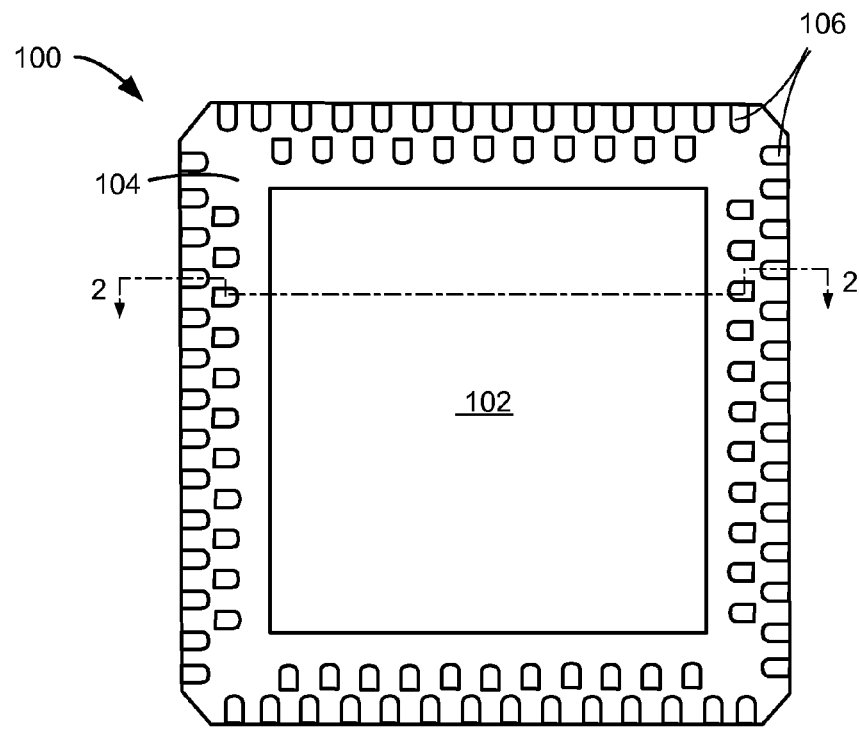
FIG. 1 is a bottom view of a stacked integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the stacked integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of a stacked integrated circuit package system 100 in an embodiment of the present invention. The bottom view depicts a paddle 102, such as a die-attach paddle, surrounded by a package encapsulation 104, such as an epoxy mold compound. The package encapsulation 104 preferably surrounds and exposes dual rows of external interconnects 106, such as leads. The external interconnects 106 preferably surround the paddle 102.

For illustrative purposes, the stacked integrated circuit package system 100 is shown having the paddle 102, although it is understood that the stacked integrated circuit package system 100 may not have the paddle 102. Also for illustrative purposes, the external interconnects 106 are shown in a dual row configuration, although it is understood that the external interconnects 106 may be in a different configuration, such as a single row or more than dual rows of the external interconnects 106. Further for illustrative purposes, the dual rows of the external interconnects 106 are shown in a staggered configuration, although it is understood that the external interconnects 106 may not be staggered from row to row.

Figure 2:
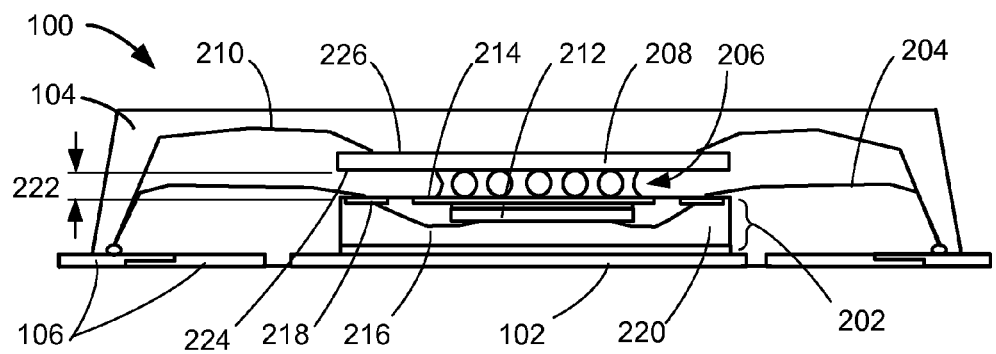
FIG. 2 is a cross-sectional view of the stacked integrated circuit package system along a line 2-2 of FIG. 1.

Referring now to FIG. 2, therein is shown a cross-sectional view of the stacked integrated circuit package system 100 along a line 2-2 of FIG. 1. The stacked integrated circuit package system 100 is shown as an integrated circuit package-in-package system. The cross-sectional view depicts the paddle 102 between the external interconnects 106. A first device 202, such as an integrated circuit package system having a non-active side, is preferably over the paddle 102 and preferably connects to the external interconnects 106 with first interconnects 204, such as bond wires or ribbon bonds. A "non-active side" for a package is defined as a side of the package not having active integrated circuit components directly under the surface as would be the case for an active side of an integrated circuit die. A conductive spacer structure 206 is preferably above the non-active side of the first device 202 and below a second device 208, such as an integrated circuit die, wherein the second device 208 is over the first device 202. Second interconnects 210 preferably connect the second device 208 and the external interconnects 106.

The package encapsulation 104 preferably covers the first device 202, the first interconnects 204, the second device 208, and the second interconnects 210 over the paddle 102 and the external interconnects 106. The package encapsulation 104 exposes the external interconnects 106 and the paddle 102 to ambient.

The first device 202 includes an integrated circuit die 212 attached to a mounting structure 214, such as a die-attach paddle. Inner interconnects 216, such as bond wires, connect the integrated circuit die 212 and terminals 218, such as bond pads, of the first device 202. An inner encapsulation 220, such as an epoxy mold compound, covers the integrated circuit die 212 and the inner interconnects 216 over the mounting structure 214 and the terminals 218. The inner encapsulation 220 exposes the mounting structure 214 and the terminals 218 on a non-active side for further connections.

For illustrative purposes, the first device 202 is shown as having the mounting structure 214, although it is understood that the first device 202 may not have the mounting structure 214. Also for illustrative purposes, the integrated circuit die 212 is shown as a wire bonded integrated circuit, although it is understood that the integrated circuit die 212 may not be a wire bonded integrated circuit, such as a flip chip.

The conductive spacer structure 206 is directly on the mounting structure 214 providing a space 222 between the first device 202 and the second device 208 for the first interconnects 204 to connect to the terminals 218. The conductive spacer structure 206 may be used as test points for the first device 202 ensuring known good device (KGD) without assembly of the stacked integrated circuit package system 100. For example, the mounting structure 214 may be connected to the integrated circuit die 212 and the conductive spacer structure 206 is connected to the mounting structure 214. The mounting structure 214 may include conductive traces (not shown) or routes (not shown) for providing a redistribution layer or a patterned circuit layer. The first device 202 may be tested using the terminals 218 and the conductive spacer structure 206.

The second device 208 includes a non-active side 224 and an active side 226 having active circuitry fabricated thereon. The second device 208 is shown facing up with the non-active side 224 facing the first device 202 and the conductive spacer structure 206. The conductive spacer structure 206 can be directly attached to the non-active side 224 of the second device 208. The second interconnects 210 connect with the active side 226.

For illustrative purposes, the second device 208 is shown as a wire bonded integrated circuit, although it is understood that the second device 208 may not be a wire bonded integrated circuit, such as a flip chip. Also for illustrative purposes, the second device 208 has the non-active side 224 facing the conductive spacer structure 206, although it is understood that the second device 208 may have the active side 226 facing the conductive spacer structure 206. Also for illustrative purposes, the conductive spacer structure 206 is shown serving a spacer function between the first device 202 and the second device 208, although it is understood that the conductive spacer structure 206 may serve other functions, such as conductive terminals between the first device 202 and the second device 208 or heat dissipation structure.

Figure 3:
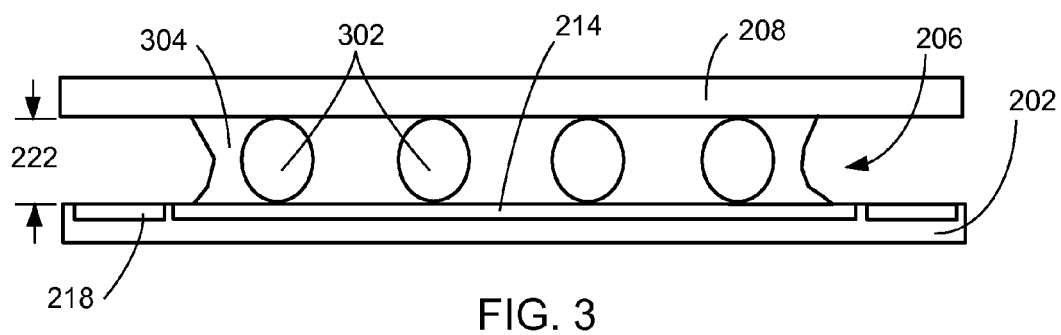
FIG. 3 is a more detailed cross-sectional view the conductive spacer structure of FIG. 1.

Referring now to FIG. 3, therein is shown a more detailed cross-sectional view the conductive spacer structure 206 of FIG. 1. The more detailed cross-sectional view depicts the conductive spacer structure 206 between the first device 202 and the second device 208. As described earlier, the first device 202 has the mounting structure 214 and the terminals 218.

The conductive spacer structure 206 includes conductive elements 302, such as bumps, balls, or posts of metal or metallic alloy, surrounded by a spacer filler 304, such as dispensed epoxy. The conductive elements 302 may serve a number of functions. For example, the conductive elements 302 may provide test points for the first device 202, may provide heat dissipation path, or may serve as communication paths between the first device 202 and the second device 208, to name a few.

The conductive elements 302 with the spacer filler 304 provides the space 222 to be more uniform between the first device 202 and the second device 208 allowing for a consistent bondline thickness (BLT). The conductive elements 302 may be formed by stacking a number of levels of the conductive elements 302 allowing an improved control of the space 222 between the first device 202 and the second device 208. The conductive elements 302 in the spacer filler 304 also allow the conductive spacer structure 206 to mitigate or to eliminate tilting of the second device 208 during assembly of the stacked integrated circuit package system 100.

The conductive spacer structure 206 provides cost reduction by enabling use of lower cost material for the spacer filler 304. For example, the spacer filler 304, such as an epoxy resin with silica, aluminum nitride, nitride particle, or other polymeric materials, may insulate the conductive elements 302 from each other. Alternatively, the spacer filler 304 may be conductive comprised of silver particle filled epoxy resin. An example of a higher cost material is an epoxy resin with a controlled, large diameter filler particle size, such as silver balls or spherical silica.

The rheological behavior of the low cost material of the spacer filler 304, the dispensing volume and pattern of the low cost material can be controlled. The addition of the conductive elements 302 at the strategic locations allows for bond line thickness control. The cost added to assembly of the stacked integrated circuit package system 100 of FIG. 1 is not significant as the conductive spacer structure 206 may be readily formed with the existing equipments. However, it is expensive to manufacture a spacer type die attach adhesive comprising a uniform and large filler particle size as spacer. Furthermore, it may be difficult to dispense the high viscous spacer type die attach epoxy and would result in a longer processing time. Moreover, it may be needed to change the existing epoxy dispensing needle to be a larger diameter one so as to prevent it from clogging. The conductive elements 302 provide adhesion interfaces to lock the spacer filler 304 in place.

Figure 4:
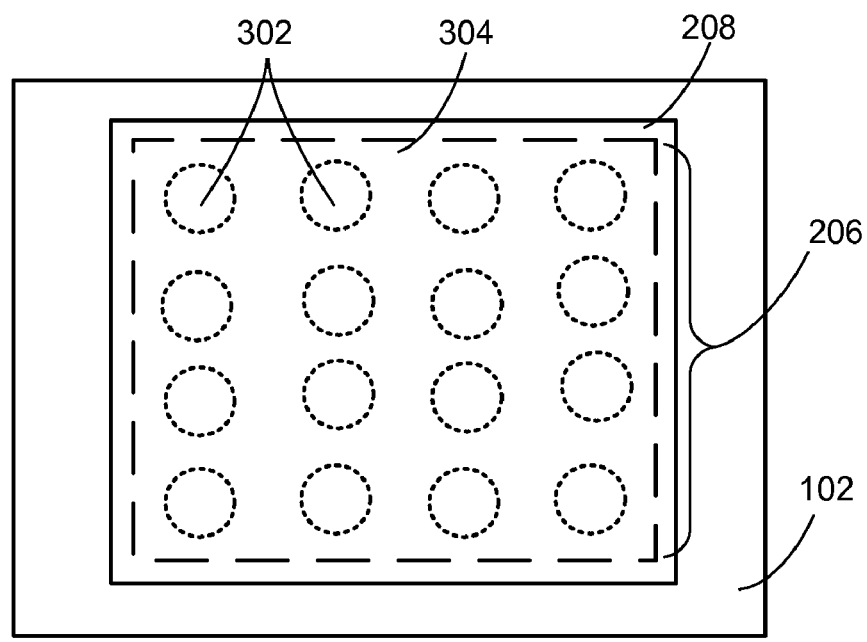
FIG. 4 is a plan view of the conductive spacer structure of FIG. 1.

Referring now to FIG. 4, therein is shown a plan view of the conductive spacer structure 206 of FIG. 1. The plan view depicts a portion of the stacked integrated circuit package system 100 of FIG. 1 without the package encapsulation 104 of FIG. 1 and over the paddle 102. The plan view depicts the second device 208 over the paddle 102. The spacer filler 304 is shown within the boundary of the second device 208. The conductive elements 302 are depicted as dotted circles in a fully distributed array configuration below the second device 208.

Figure 5:
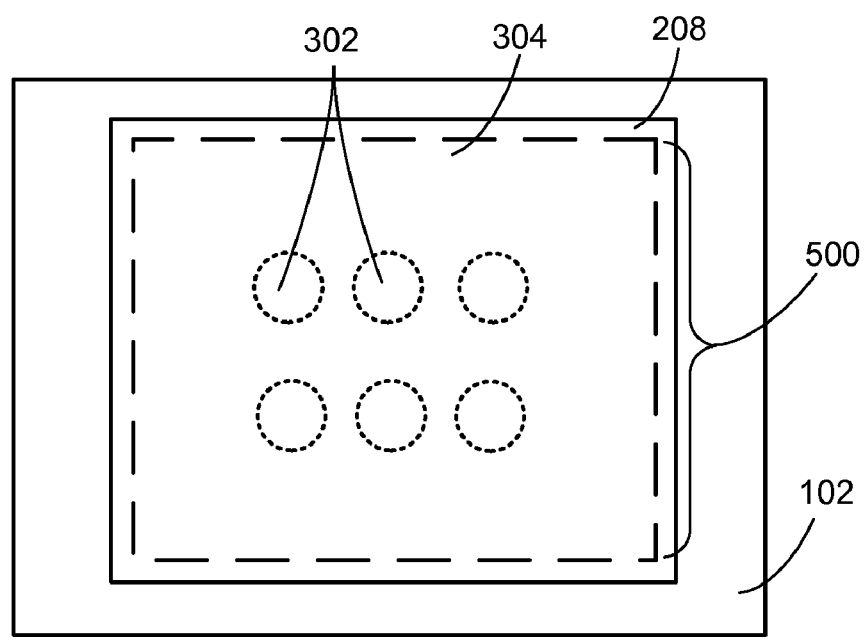
FIG. 5 is a plan view of a conductive spacer structure in an alternative embodiment of the present invention.

Referring now to FIG. 5, therein is shown a plan view of a conductive spacer structure 500 in an alternative embodiment of the present invention. The conductive spacer structure 500 may be the conductive spacer structure 206 of FIG. 2 in the stacked integrated circuit package system 100 of FIG. 1.

The plan view depicts a portion of the stacked integrated circuit package system 100 without the package encapsulation 104 of FIG. 1 and over the paddle 102. The plan view depicts the second device 208 over the paddle 102. The spacer filler 304 is shown within the boundary of the second device 208. The conductive elements 302 are depicted as dotted circles in a center array configuration below the second device 208.

Figure 6:
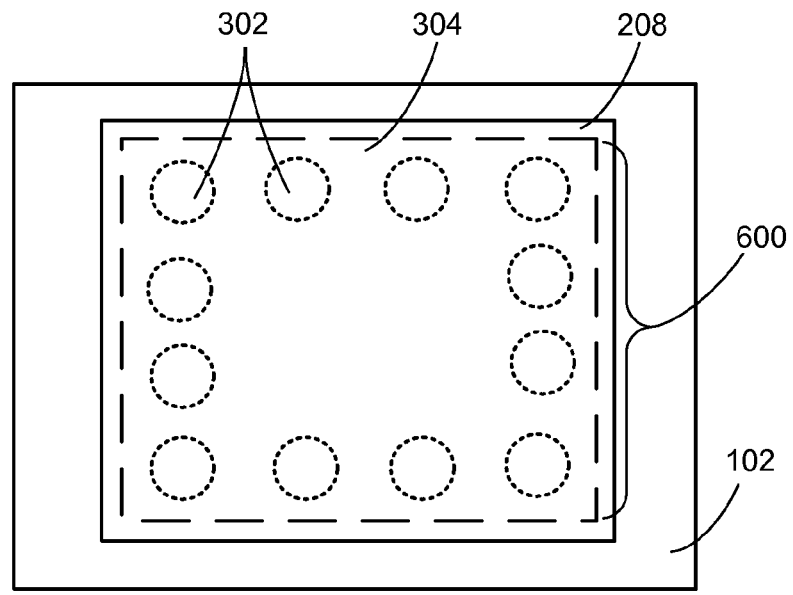
FIG. 6 is a plan view of a conductive spacer structure in another alternative embodiment of the present invention.

Referring now to FIG. 6, therein is shown is a plan view of a conductive spacer structure 600 in another alternative embodiment of the present invention. The conductive spacer structure 600 may be the conductive spacer structure 206 of FIG. 2 in the stacked integrated circuit package system 100 of FIG. 1.

The plan view depicts a portion of the stacked integrated circuit package system 100 without the package encapsulation 104 of FIG. 1 and over the paddle 102. The plan view depicts the second device 208 over the paddle 102. The spacer filler 304 is shown within the boundary of the second device 208. The conductive elements 302 are depicted as dotted circles in a peripheral configuration below the second device 208.

The conductive spacer structure 206 may be formed in different configurations, such as those illustrated in FIG. 4, FIG. 5, and FIG. 6. The conductive spacer structure 206 also may be formed in a symmetrical and asymmetrical configuration.

Figure 7:
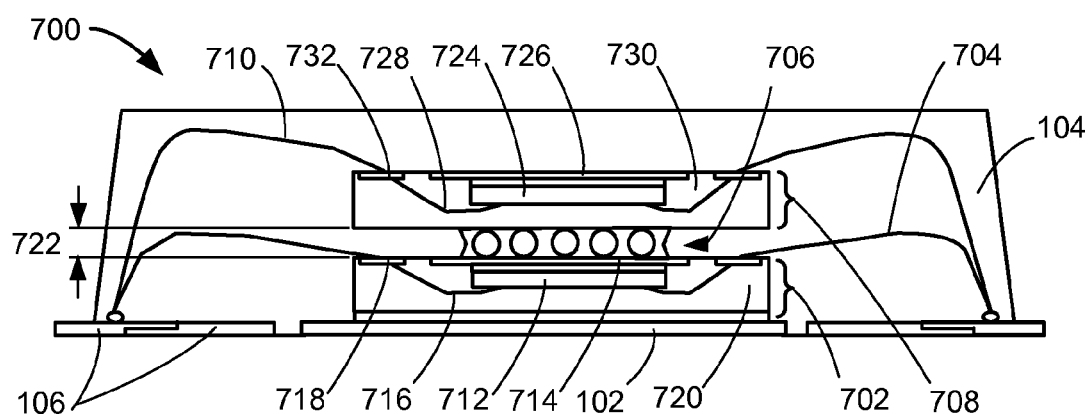
FIG. 7 is a cross-sectional view of a stacked integrated circuit package system along a line 2-2 of FIG. 1 in an alternative embodiment of the present invention.

Referring now to FIG. 7, therein is shown a cross-sectional view of a stacked integrated circuit package system 700 along a line 2-2 of FIG. 1 in an alternative embodiment of the present invention. The bottom view of the stacked integrated circuit package system 100 of FIG. 1 may also represent the bottom view of the stacked integrated circuit package system 700. The stacked integrated circuit package system 700 is shown as an integrated circuit package-in-package system.

The cross-sectional view depicts the paddle 102 between the external interconnects 106. A first device 702, such as an integrated circuit package system, is preferably over the paddle 102 and preferably connects to the external interconnects 106 with first interconnects 704, such as bond wires or ribbon bonds. A conductive spacer structure 706 is preferably between the first device 702 and a second device 708, such as an integrated circuit package system, wherein the second device 708 is over the first device 702. Second interconnects 710 preferably connect the second device 708 and the external interconnects 106.

The package encapsulation 104 preferably covers the first device 702, the first interconnects 704, the second device 708, and the second interconnects 710 over the paddle 102 and the external interconnects 106. The package encapsulation 104 also exposes the external interconnects 106 and the paddle 102 to ambient.

The first device 702 includes a first integrated circuit die 712 attached to a first mounting structure 714, such as a die-attach paddle. First inner interconnects 716, such as bond wires, connect the first integrated circuit die 712 and first terminals 718, such as bond pads, of the first device 702. A first inner encapsulation 720, such as an epoxy mold compound, covers the first integrated circuit die 712 and the first inner interconnects 716 over the first mounting structure 714 and the first terminals 718. The first inner encapsulation 720 exposes the first mounting structure 714 and the first terminals 718 on a non-active side for further connections.

For illustrative purposes, the first device 702 is shown as having the first mounting structure 714, although it is understood that the first device 702 may not have the first mounting structure 714. Also for illustrative purposes, the first integrated circuit die 712 is shown as a wire bonded integrated circuit, although it is understood that the first integrated circuit die 712 may not be a wire bonded integrated circuit, such as a flip chip.

The conductive spacer structure 706 is over the first mounting structure 714 providing a space 722 between the first device 702 and the second device 708 for the first interconnects 704 to connect to the first terminals 718. The conductive spacer structure 706 may be used as test points for the first device 702 ensuring known good device (KGD) without assembly of the stacked integrated circuit package system 700. For example, the first mounting structure 714 may be connected to the first integrated circuit die 712 and the conductive spacer structure 706 is connected to the first mounting structure 714. The first mounting structure 714 may include conductive traces (not shown) or routes (not shown) for providing a redistribution layer or a patterned circuit layer. The first device 702 may be tested using the first terminals 718 and the conductive spacer structure 706.

The second device 708 includes a second integrated circuit die 724 attached to a second mounting structure 726, such as a die-attach paddle. Second inner interconnects 728, such as bond wires, connect the second integrated circuit die 724 and second terminals 732, such as bond pads, of the second device 708. A second inner encapsulation 730, such as an epoxy mold compound, covers the second integrated circuit die 724 and the second inner interconnects 728 over the second mounting structure 726 and the second terminals 732. The second inner encapsulation 730 exposes the second mounting structure 726 and the second terminals 732 for further connections.

For illustrative purposes, the second device 708 is shown as having the second mounting structure 726, although it is understood that the second device 708 may not have the second mounting structure 726. Also for illustrative purposes, the second integrated circuit die 724 is shown as a wire bonded integrated circuit, although it is understood that the second integrated circuit die 724 may not be a wire bonded integrated circuit, such as a flip chip. Further for illustrative purposes, the first device 702 and the second device 708 are shown as substantially the same, although it is understood that the first device 702 and the second device 708 may be different, such as different sizes or functions.

Yet further for illustrative purposes, the second device 708 has the second terminals 732 facing away from the conductive spacer structure 706, although it is understood that the second device 708 may have the second terminals 732 facing the conductive spacer structure 706. Still further for illustrative purposes, the conductive spacer structure 706 is shown serving a spacer function between the first device 702 and the second device 708, although it is understood that the conductive spacer structure 706 may serve other functions, such as conductive terminals between the first device 702 and the second device 708 or heat dissipation structure.

Figure 8:
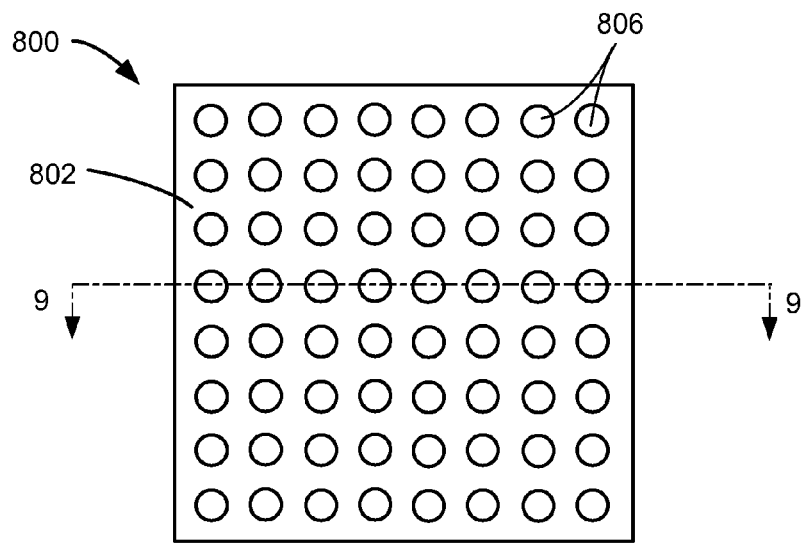
FIG. 8 is a bottom view of a stacked integrated circuit package system in another alternative embodiment of the present invention.

Referring now to FIG. 8, therein is shown a bottom view of a stacked integrated circuit package system 800 in another alternative embodiment of the present invention. The bottom view depicts a package carrier 802, such as a laminated substrate, having external interconnects 806, such as solder balls, thereon.

For illustrative purposes, the external interconnects 806 are shown as in an array configuration, although it is understood that the external interconnects 806 may be in a different configuration, such as a peripheral configuration. Also for illustrative purposes, the external interconnects 806 are shown as solder balls, although it is understood that the external interconnects 806 may be different connection structures, such as bond pads or exposed leads.

Figure 9:
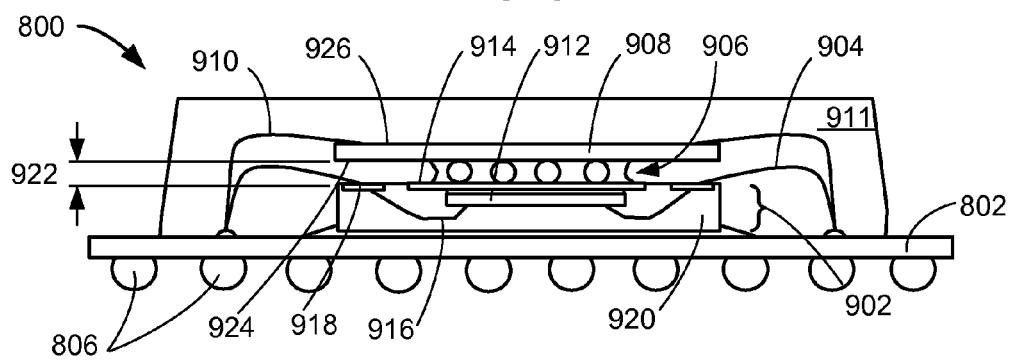
FIG. 9 is a cross-sectional view of the stacked integrated circuit package system along a line 9-9 of FIG. 8.

Referring now to FIG. 9, therein is shown a cross-sectional view of the stacked integrated circuit package system 800 along a line 9-9 of FIG. 8. The stacked integrated circuit package system 800 is shown as an integrated circuit package-in-package system. The cross-sectional view depicts the package carrier 802 over the external interconnects 806. A first device 902, such as an integrated circuit package system, is preferably over the package carrier 802 and preferably connects to the package carrier 802 with first interconnects 904, such as bond wires or ribbon bonds. A conductive spacer structure 906 is preferably between the first device 902 and a second device 908, such as an integrated circuit die, wherein the second device 908 is over the first device 902. Second interconnects 910 preferably connect the second device 908 and the external interconnects 806. The package carrier 802 may function as a redistribution layer routing signals between the first device 902, the second device 908, and the external interconnects 806.

A package encapsulation 911 preferably covers the first device 902, the first interconnects 904, the second device 908, and the second interconnects 910 over the package carrier 802. The package encapsulation 911 exposes a side of the package carrier 802 opposite the side facing the first device 902.

The first device 902 includes an integrated circuit die 912 attached to a mounting structure 914, such as a die-attach paddle. Inner interconnects 916, such as bond wires, connect the integrated circuit die 912 and terminals 918, such as bond pads, of the first device 902. An inner encapsulation 920, such as an epoxy mold compound, covers the integrated circuit die 912 and the inner interconnects 916 over the mounting structure 914 and the terminals 918. The inner encapsulation 920 exposes the mounting structure 914 and the terminals 918 on a non-active side for further connections.

For illustrative purposes, the first device 902 is shown as having the mounting structure 914, although it is understood that the first device 902 may not have the mounting structure 914. Also for illustrative purposes, the integrated circuit die 912 is shown as a wire bonded integrated circuit, although it is understood that the integrated circuit die 912 may not be a wire bonded integrated circuit, such as a flip chip.

The conductive spacer structure 906 is over the mounting structure 914 providing a space 922 between the first device 902 and the second device 908 for the first interconnects 904 to connect to the terminals 918. The conductive spacer structure 906 may be used as test points for the first device 902 ensuring known good device (KGD) without assembly of the stacked integrated circuit package system 800. For example, the mounting structure 914 may be connected to the integrated circuit die 912 and the conductive spacer structure 906 is connected to the mounting structure 914. The mounting structure 914 may include conductive traces (not shown) or routes (not shown) for providing a redistribution layer or a patterned circuit layer. The first device 902 may be tested using the terminals 918 and the conductive spacer structure 906.

The second device 908 includes a non-active side 924 and an active side 926 having active circuitry fabricated thereon. The second device 908 is shown facing up with the non-active side 924 facing the first device 902 and the conductive spacer structure 906. The second interconnects 910 connect with the active side 926.

For illustrative purposes, the second device 908 is shown as a wire bonded integrated circuit, although it is understood that the second device 908 may not be a wire bonded integrated circuit, such as a flip chip. Also for illustrative purposes, the second device 908 has the non-active side 924 facing the conductive spacer structure 906, although it is understood that the second device 908 may have the active side 926 facing the conductive spacer structure 906. Also for illustrative purposes, the conductive spacer structure 906 is shown serving a spacer function between the first device 902 and the second device 908, although it is understood that the conductive spacer structure 906 may serve other functions, such as conductive terminals between the first device 902 and the second device 908 or heat dissipation structure.

Figure 10:
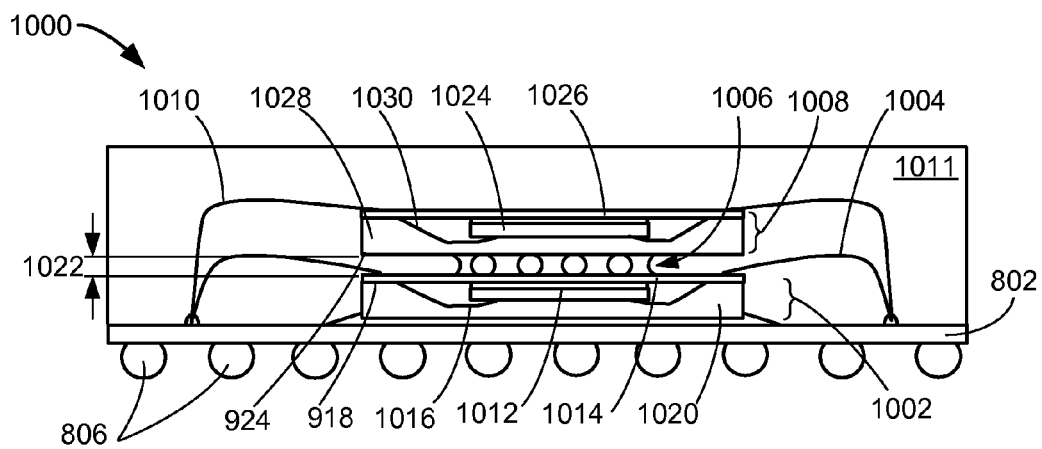
FIG. 10 is a cross-sectional view of a stacked integrated circuit package system along a line 9-9 of FIG. 8 in yet another alternative embodiment of the present invention.

Referring now to FIG. 10, therein is shown a cross-sectional view of a stacked integrated circuit package system 1000 along a line 9-9 of FIG. 8 in yet another alternative embodiment of the present invention. The bottom view of the stacked integrated circuit package system 800 of FIG. 8 may also represent the bottom view of the stacked integrated circuit package system 1000. The stacked integrated circuit package system 1000 is shown as an integrated circuit package-in-package system.

The cross-sectional view depicts the package carrier 802, such as a laminated substrate, over the external interconnects 806, such as solder balls. A first device 1002, such as an integrated circuit package system, is preferably over the package carrier 802 and preferably connects to the package carrier 802 with first interconnects 1004, such as bond wires or ribbon bonds. A conductive spacer structure 1006 is preferably between the first device 1002 and a second device 1008, such as an integrated circuit package system, wherein the second device 1008 is over the first device 1002. Second interconnects 1010 preferably connect the second device 1008 and the package carrier 802. The package carrier 802 may function as a redistribution layer routing signals between the first device 1002, the second device 1008, and the external interconnects 806.

A package encapsulation 1011 preferably covers the first device 1002, the first interconnects 1004, the second device 1008, and the second interconnects 1010 over the package carrier 802. The package encapsulation 1011 exposes a side of the package carrier 802 opposite the side facing the first device 1002.

The first device 1002 includes a first integrated circuit die 1012 attached to a first substrate 1014, such as a laminated substrate. The first substrate 1014 preferably provides a redistribution layer for communication between the first integrated circuit die 1012 and the first interconnects 1004. First inner interconnects 1016, such as bond wires, connect the first integrated circuit die 1012 and the first substrate 1014. For illustrative purposes, the first integrated circuit die 1012 is shown as a wire bonded integrated circuit, although it is understood that the first integrated circuit die 1012 may not be a wire bonded integrated circuit, such as a flip chip.

A first inner encapsulation 1020, such as an epoxy mold compound, covers the first integrated circuit die 1012 and the first inner interconnects 1016 over the first substrate 1014. The first inner encapsulation 1020 exposes the first substrate 1014 on a non-active side for further connections.

The conductive spacer structure 1006 is over the first substrate 1014 providing a space 1022 between the first device 1002 and the second device 1008 for the first interconnects 1004 to connect to the first substrate 1014. The conductive spacer structure 1006 may be used as test points for the first device 1002 ensuring known good device (KGD) without assembly of the stacked integrated circuit package system 1000. For example, the first substrate 1014 may be connected to the first integrated circuit die 1012 and the conductive spacer structure 1006 is connected to the first substrate 1014. The first device 1002 may be tested using the first substrate 1014 and the conductive spacer structure 1006.

The second device 1008 includes a second integrated circuit die 1024 attached to a second substrate 1026, such as a laminated substrate. The second substrate 1026 preferably provides a redistribution layer for communication between the second integrated circuit die 1024 and the second interconnects 1010. Second inner interconnects 1030, such as bond wires, connect the second integrated circuit die 1024 and the second substrate 1026.

A second inner encapsulation 1028, such as an epoxy mold compound, covers the second integrated circuit die 1024 and the second inner interconnects 1030 over the second substrate 1026. The second inner encapsulation 1028 exposes the second substrate 1026 for further connections.

For illustrative purposes, the second integrated circuit die 1024 is shown as a wire bonded integrated circuit, although it is understood that the second integrated circuit die 1024 may not be a wire bonded integrated circuit, such as a flip chip. Also for illustrative purposes, the first device 1002 and the second device 1008 are shown as substantially the same, although it is understood that the first device 1002 and the second device 1008 may be different, such as different sizes or functions.

Further for illustrative purposes, the second device 1008 has the second substrate 1026 facing away from the conductive spacer structure 1006, although it is understood that the second device 1008 may have the second substrate 1026 facing the conductive spacer structure 1006. Yet further for illustrative purposes, the conductive spacer structure 1006 is shown serving a spacer function between the first device 1002 and the second device 1008, although it is understood that the conductive spacer structure 1006 may serve other functions, such as conductive terminals between the first device 1002 and the second device 1008 or heat dissipation structure.

Figure 11:
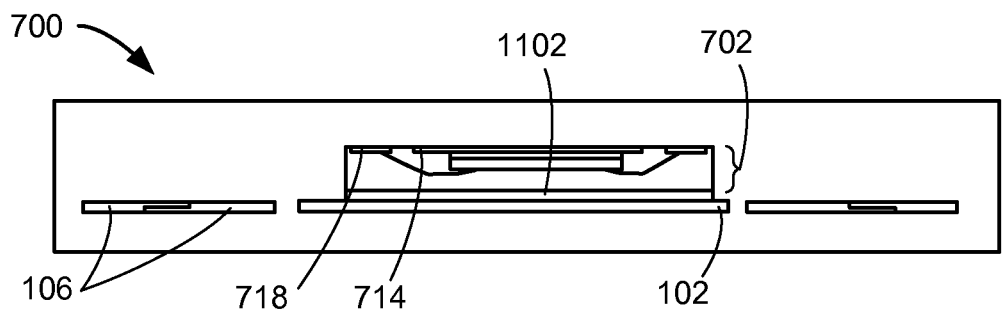
FIG. 11 is a cross-sectional view of the stacked integrated circuit package system of FIG. 7 in a phase attaching the first device.

Referring now to FIG. 11, therein is shown a cross-sectional view of the stacked integrated circuit package system 700 of FIG. 7 in a phase attaching the first device 702. The cross-sectional view depicts the paddle 102 between the external interconnects 106. The first device 702 attaches to the paddle 102 with an adhesive 1102, such as an epoxy. The first mounting structure 714 and the first terminals 718 are exposed and facing away from the paddle 102.

Figure 12:
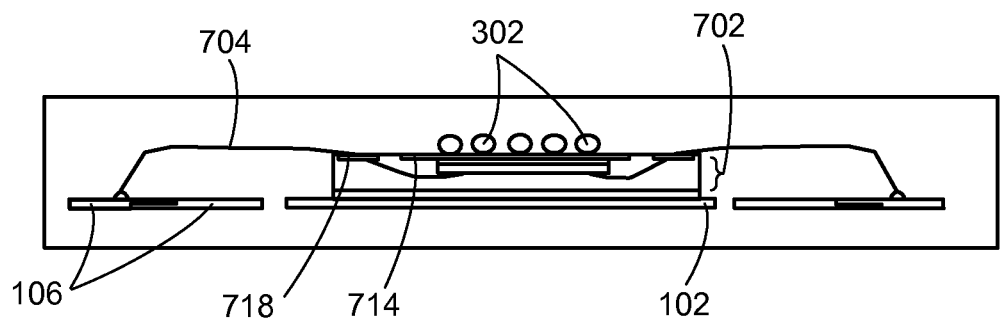
FIG. 12 is the structure of FIG. 11 in a phase attaching the conductive elements and the first interconnects.

Referring now to FIG. 12, therein is shown the structure of FIG. 11 in a phase attaching the conductive elements 302 and the first interconnects 704. The first device 702 over the paddle 102 has the first mounting structure 714 and the first terminals 718 exposed for further connections. The conductive elements 302 are formed on the first mounting structure 714. The first interconnects 704 connect the first terminals 718 and the external interconnects 106. The conductive elements 302 and the first interconnects 704 may be formed by a number different methods. For example, the conductive elements 302 and the first interconnects 704 may be formed with a single pass of the wire bonding cantilever to attach the first interconnects 704 and to place the conductive elements 302 on the first mounting structure 714.

Figure 13:
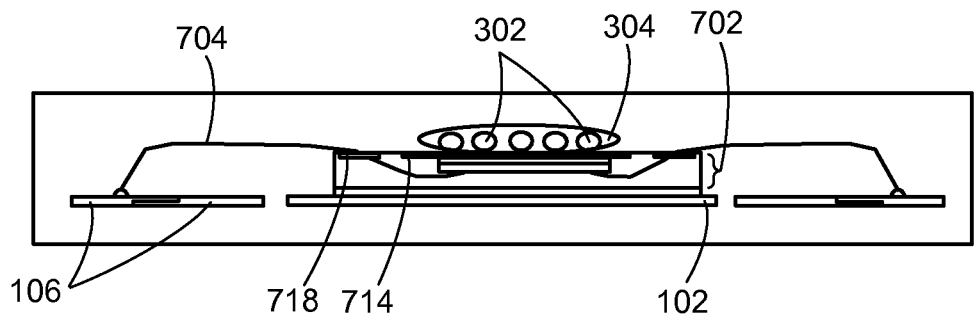
FIG. 13 is the structure of FIG. 12 in a phase dispensing the spacer filler.

Referring now to FIG. 13, therein is shown the structure of FIG. 12 in a phase dispensing the spacer filler 304. The first device 702 is over the paddle 102. The first device 702 also has the conductive elements 302 over the first mounting structure 714. The first interconnects 704 connect the first terminals 718 and the external interconnects 106. The spacer filler 304 is dispensed over the conductive elements 302 and the first mounting structure 714. The spacer filler 304 does not contaminate the first terminals 718 or the first interconnects 704.

Figure 14:
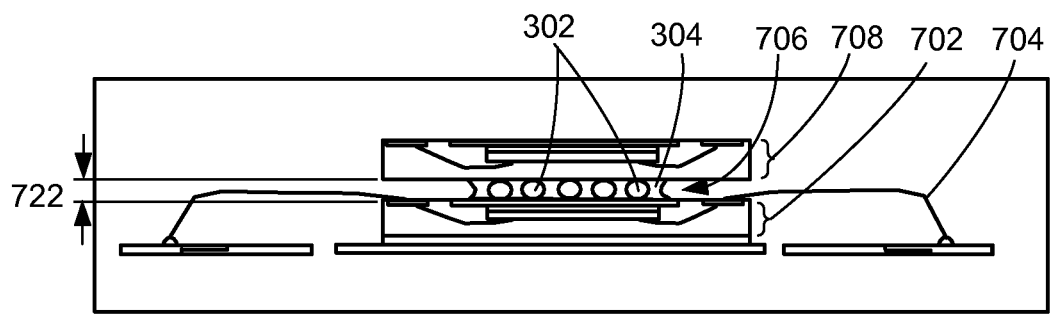
FIG. 14 is the structure of FIG. 13 in a phase attaching the second device.

Referring now to FIG. 14, therein is shown the structure of FIG. 13 in a phase attaching the second device 708. The second device 708 mounts over the first device 702 compressing the spacer filler 304. The space 722 between the first device 702 and the second device 708 is uniform from the support provided by the conductive elements 302 of the conductive spacer structure 706. The conductive spacer structure 706 provides the space 722 such that the second device 708 does not perturb the first interconnects 704 in the space 722.

Figure 15:
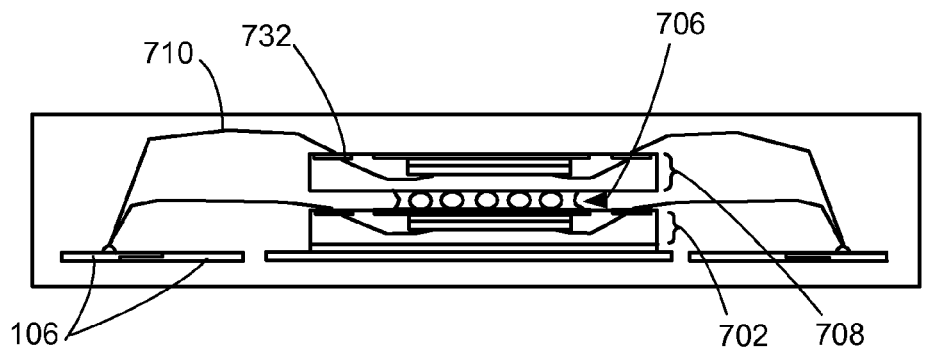
FIG. 15 is the structure of FIG. 14 in a phase attaching the second interconnects.

Referring now to FIG. 15, therein is shown the structure of FIG. 14 in a phase attaching the second interconnects 710. The second device 708 stacks over the first device 702 with the conductive spacer structure 706 in between. The second interconnects 710 connect the second terminals 732 and the external interconnects 106 with the conductive spacer structure 706 mitigating or eliminating tilt of the second device 708.

Figure 16:
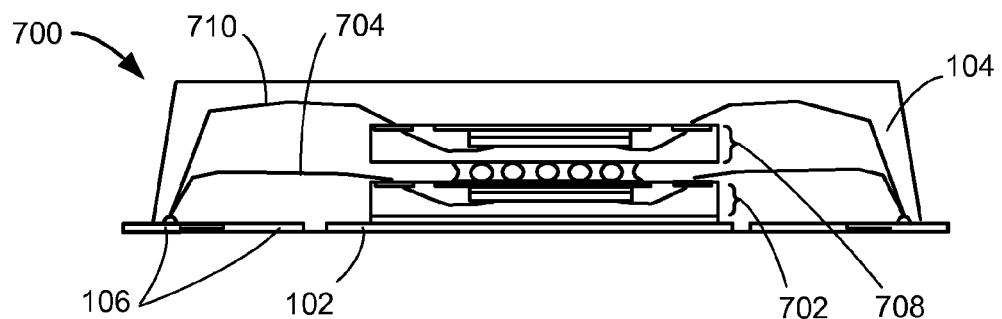
FIG. 16 is the structure of FIG. 15 in a phase molding the package encapsulation.

Referring now to FIG. 16, therein is shown the structure of FIG. 15 in a phase molding the package encapsulation 104. The package encapsulation 104 is preferably molded covering the first device 702, the first interconnects 704, the second device 708, and the second interconnects 710 over the paddle 102 and the external interconnects 106. The package encapsulation 104 also exposes the external interconnects 106 and the paddle 102 to ambient. The molding process forms the stacked integrated circuit package system 700.

Figure 17:
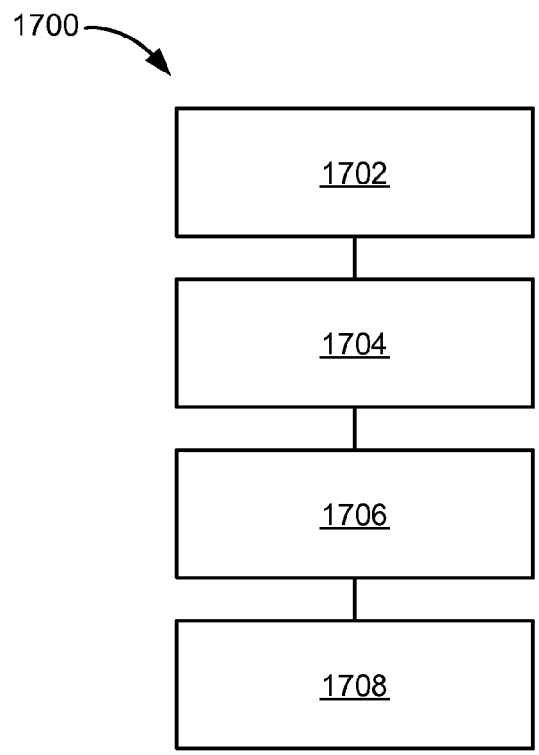
FIG. 17 is a flow chart of a stacked integrated circuit package system for manufacture of the stacked integrated circuit package system in an embodiment of the present invention.

Referring now to FIG. 17, therein is shown a flow chart of a stacked integrated circuit package system 1700 for manufacture of the stacked integrated circuit package system 100 in an embodiment of the present invention. The system 1700 includes providing a first device and a second device with the first device, the second device, or a combination thereof having an integrated circuit die in a block 1702; forming a conductive spacer structure over the first device with the conductive spacer structure having a spacer filler around a conductive element in a block 1704; mounting a second device over the conductive spacer structure and the first device in a block 1706; and encapsulating the first device, the second device, and the conductive spacer structure in a block 1708.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the stacked integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing stacked integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stacked integrated circuit package system comprising:
   a first device having an integrated circuit die attached to a mounting structure;
   a conductive element directly on the mounting structure of the first device;
   a conductive spacer structure having a spacer filler around the conductive element;
   a second device over the conductive spacer structure and the first device, the conductive spacer structure directly attached to a non-active side of the second device and the conductive spacer structure between the second device and the first device; and
   an encapsulation over the first device, the second device, and the conductive spacer structure.

2. The system as claimed in claim 1 wherein the conductive spacer structure includes a space, formed by the conductive spacer structure, for consistent bondline thickness between the first device and the second device.

3. The system as claimed in claim 1 wherein the conductive spacer structure having the spacer filler around the conductive element includes the spacer filler on the first device.

4. The system as claimed in claim 1 further comprising an interconnect connected with the first device in a space between the first device and the second device formed by the conductive spacer structure.

5. The system as claimed in claim 1 wherein the conductive spacer structure having the spacer filler around the conductive element includes the conductive element connected with the integrated circuit die of the first device.

6. The system as claimed in claim 1 further comprising an external interconnect connected with the first device.

7. The system as claimed in claim 6 further comprising a paddle with the first device thereover.

8. The system as claimed in claim 6 wherein the external interconnect connected with the first device includes a package carrier with the first device thereover and the external interconnect attached with the package carrier on an opposing side with the first device.

9. The system as claimed in claim 6 wherein the external interconnect is connected with the second device.

10. The system as claimed in claim 6 wherein the first device includes an inner encapsulation to cover the integrated circuit die.

* * * * *